United States Patent [19]
Hunt et al.

[11] Patent Number: 5,657,019
[45] Date of Patent: Aug. 12, 1997

[54] ANALOG TO DIGITAL CONVERTER

[75] Inventors: Kenneth Stephen Hunt, Camberley; William Eric Corr, Twickenham, both of United Kingdom

[73] Assignee: LSI Logic Corporation, Milpitas

[21] Appl. No.: 466,383

[22] Filed: Jun. 6, 1995

[30] Foreign Application Priority Data

Jan. 20, 1994 [GB] United Kingdom ............ 9501152

[51] Int. Cl.$^6$ ............................................. H03M 1/10
[52] U.S. Cl. ............................................. 341/120
[58] Field of Search ............................ 341/120, 159, 341/160, 118, 155

[56] References Cited

U.S. PATENT DOCUMENTS 5,023,613  6/1991  Dingwall ........................ 341/118
5,124,704  6/1992  Kase et al. ..................... 341/120

Primary Examiner—Brian K. Young
Attorney, Agent, or Firm—Katz & Cotton, L.L.P.

[57] ABSTRACT

An analog to digital converter has an analog signal input, reference voltage divider and a plurality of comparators. Each comparator has a first input connected to said analog signal input and a reference input connected to receive a respective predetermined reference voltage from the reference voltage divider. In addition, test mode circuitry is provided for feeding a sequence of test voltages from the voltage divider to the first input of the comparators in a test mode. A decoder is connected to an output of each comparator for generating a binary output signal representative of an input analog signal.

25 Claims, 7 Drawing Sheets (FOR CONT. SEE FIG. 5A)

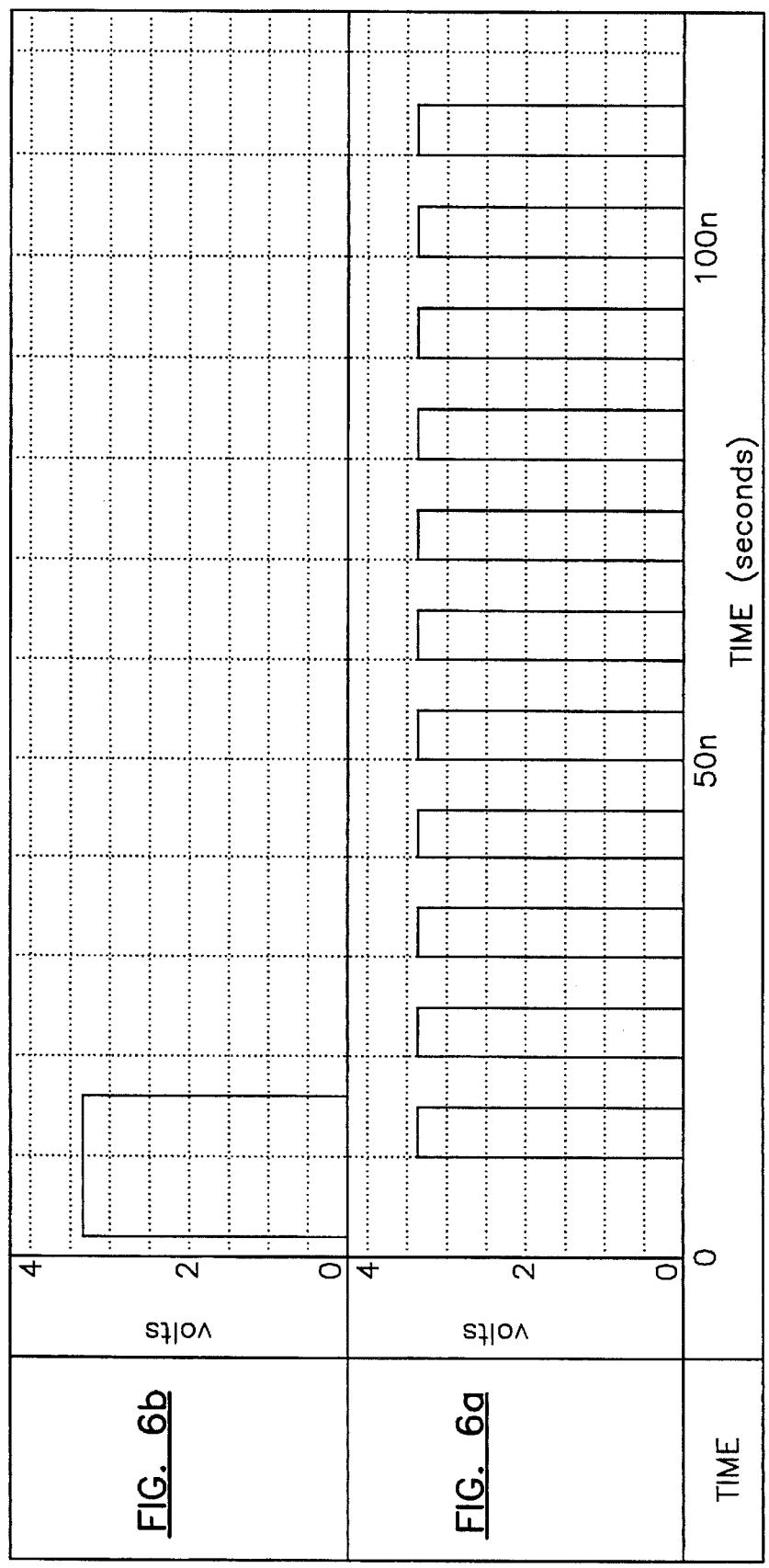

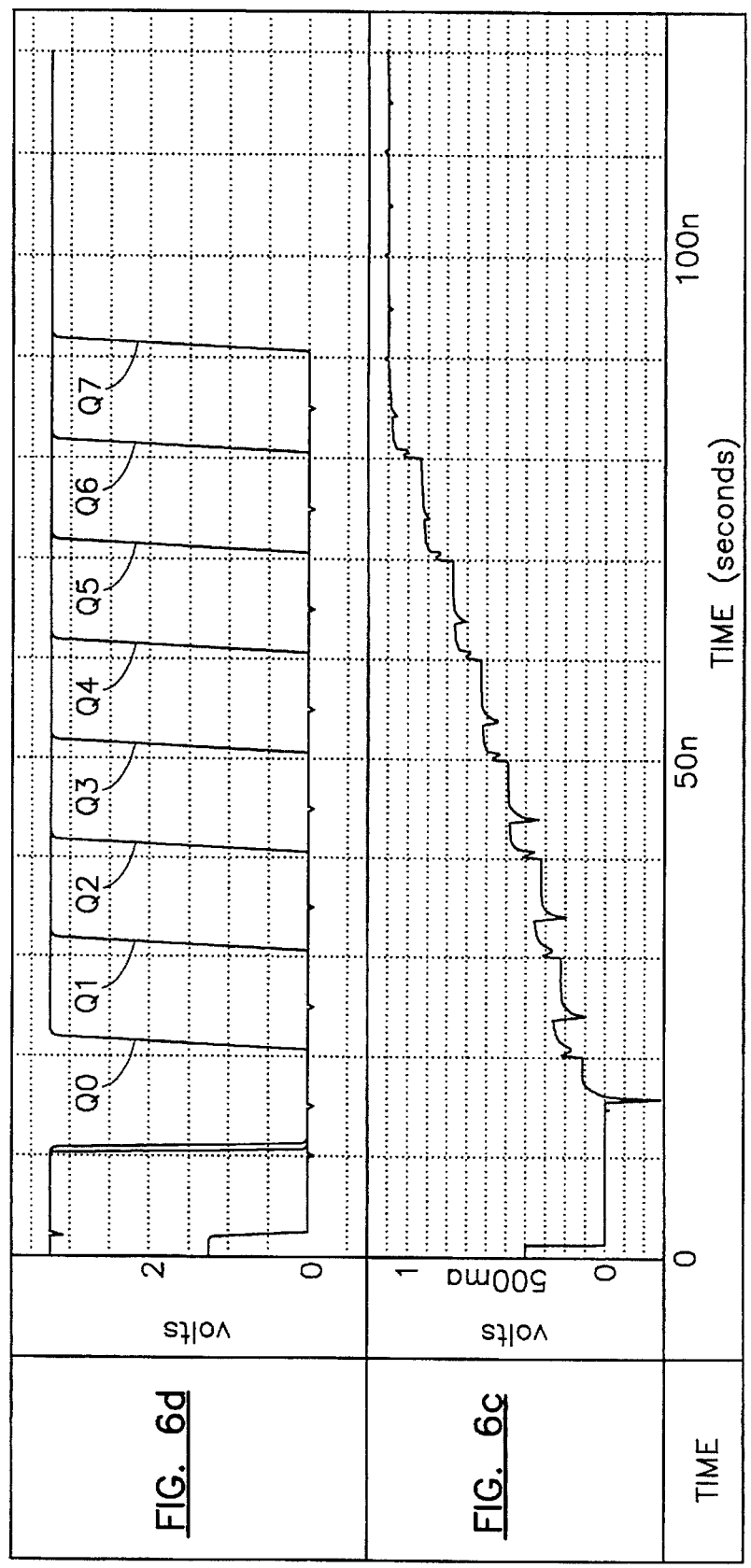

ANALOG TO DIGITAL CONVERTER

SPECIFICATION

CROSS REFERENCE TO RELATED PATENT APPLICATION

This patent application is related to and claims foreign priority under 35 U.S.C. § 119 of United Kingdom Patent Application Number 9501152.4, filed Jan 20, 1995.

BACKGROUND OF THE INVENTION

1. Field of Invention

The invention relates to analog to digital converters and, more particularly, to the testing of analog to digital converters such as an analog to digital converter of the type generally known as a "flash" analog to digital converter.

2. Discussion of the Related Art

FIG. 1 of the accompanying drawings illustrates an example of such a "flash" converter. The analog to digital converter illustrated in FIG. 1 comprises an analog input IN, a voltage divider in the form of a resistor chain R0, R1, R2, R3, . . . , R255 which extends between a first reference voltage line G (e. g. at ground potential) and a supply voltage line S (for example a positive supply voltage). A plurality of comparators C0, C1, C2, . . . , C255 is connected in parallel via an analog signal line AS to the input IN and each of the comparators C0, C1, C2, . . . , C255 is connected to a respective voltage tap in the voltage divider chain R0–R255. In order to take account of changing input voltages, the comparators C0, C1, C2, . . . , C255 sample the input voltage at the input IN in response to a clock signal supplied at CL.

A binary signal is output from each of the comparators C0, C1, C2, . . . , C255 to indicate whether the input signal IN when it is sampled is greater or less than the reference voltage supplied at the reference input to the comparator concerned. Typically, a logical one output is output from a comparator C0, C1, C2, . . . , C255 if the input voltage is greater than the reference voltage at its reference input. For example, if the input voltage at a particular sample time is intermediate the reference voltages at comparators C1 and C2, the output from comparators C1 and C0 will be 1 and the output from all other comparators will be 0. Similarly, if the input voltage at IN is intermediate the reference voltages input at the reference inputs to comparators C40 and C41, the output of comparators C0–C40 will be 1 and the output of all the other comparators will be 0.

In order to provide a compact binary output, in FIG. 1 an eight bit binary output OUT, a decoder D is provided for decoding the signals output by the comparators C0–C255. It will be appreciated in the particular examples shown in FIG. 1 that, in order to provide a linear conversion from the analog input voltages at IN to an eight bit binary output at OUT 256 comparators C0–C255 are required having as reference inputs respective taps in a linear chain of 256 resistive elements R0–R255, each resistive element having a predetermined resistancer.

With the two examples mentioned above, the digital output for an input signal having a voltage intermediate the reference voltages for comparators C1 and C2 will be 00000010. The corresponding eight bit binary output for an input voltage at IN intermediate the reference voltages for comparators C40 and C41 will be 00010100.

It will be appreciated that it is difficult to guarantee absolute manufacturing accuracy with integrated circuits for implementing an analog to digital converter such as is illustrated in FIG. 1. Accordingly, it is desirable that such analog to digital converters are tested, at least on a batch basis, before being issued to customers.

Testing has traditionally been performed by deriving a set of digital test vectors and test program code that will apply a fixed voltage to the input pin IN of the analog to digital converter at an appropriate point in the test program. The program is arrange to read the digital code from the analog to digital converter. A new fixed voltage is then applied and a new value read. This process would need to be repeated until every combination of digital outputs had been switched in order to provide complete testing of the analog to digital converter.

However, for an eight-bit analog to digital converter, 256 different fixed voltages would have to be manually coded into a test program. In practice, this is too time consuming and would not be done. Typically, only a voltage for each output pin would be used, for example 00000001, 00000010, etc. It will be appreciated that this process cannot guarantee full coverage and so there remains a risk of delivering faulty parts.

Ideally, it is desirable to test whether all of the resistive elements are present in the integrated circuit and have correct values, whether the comparators are correct and do not introduce an additional voltage offset, and whether the whole circuit operates correctly together as a system.

FIG. 2 of the accompanying drawings is a schematic representation of a conventional analog to digital converter showing the external connections. It will be appreciated that it is a difficult matter to interpret what is going on inside the integrated circuit with the limited external connections.

SUMMARY OF THE INVENTION

It is therefore an object of the present invention to overcome, or at least to mitigate the problems of prior art analog to digital converters discussed above.

In accordance with a first aspect of the invention, there is provided an analog to digital converter comprising an analog signal line, reference voltage divider, a plurality of comparator stages, each comparator stage having a first comparator input connected to the analog signal line and a second comparator input connected to receive a respective predetermined reference voltage from the reference voltage divider, and test mode circuitry for sequentially feeding a succession of test voltages from the voltage divider to the analog signal line for testing the converter.

By providing test mode circuitry in the analog to digital converter for feeding a sequence of test voltages from the voltage divider to the inputs of the comparators, it is possible to automatically generate the test sequence.

Preferably, the sequence of test voltages are voltages intermediate the predetermined reference voltages. In this manner each stage of the converter can be tested individually.

Preferably each comparator stage comprises first and second voltage divider outputs, the first voltage divider output of a stage being connected to the second comparator input of said stage and the second voltage divider output being connected via a stage test path to the analog signal line.

In a preferred embodiment of the invention, the reference voltage divider comprises a chain of pairs of series connected resistor elements, the first and second voltage divider outputs for successive stages being defined at the junctions between alternate resistor elements.

The test path preferably comprises a plurality of switches, in the preferred example of the invention, the switches of a comparator stage being connected in series. A first switch of a comparator stage is connected to a test input and is arranged to close on the application of a test mode signal to the test input. A second switch of a comparator stage is connected to a comparator output of said stage and is arranged to close on the output of a first predetermined comparison output signal (e.g., a comparison output signal indicative of a voltage at the first comparator input being less than a voltage at the second comparator input for said stage). A third switch of a comparator stage is connected to a comparator output of a neighboring stage (e.g., an immediately preceding lower order stage) and is arranged to close on the output of a second predetermined comparison output signal from the neighboring stage (e.g., a comparison output signal is indicative of a voltage at the first comparator input being greater than a voltage at the second comparator input for the neighboring stage).

In a preferred embodiment of the invention, each comparator stage comprises a comparator having a reference input connected to a predetermined reference tap of the voltage divider, a test path connected to a tap intermediate the predetermined reference taps of adjacent comparator stages, the test path comprising in series a first switch connected to a test input and arranged to close on the application of a test mode signal to the test input and a second switch connected to an output of the comparator and arranged to close on the output of a first predetermined comparison output from the comparator and wherein each comparator stage apart from a lowest order comparator stage additionally comprises a third switch connected to an output of the comparator of a preceding lower order stage and arranged to close on the output of a second predetermined comparison output from the comparator of the preceding stage.

Preferably, the first input of the comparators are connected to the analog signal line is connected to an analog signal input via an isolation switch, the isolation switch being connected to a test input (e.g., via an inverter) and being responsive to a test input signal at the test input to isolate the analog signal line from the analog signal input. In this manner the test mode can be performed without corruption from externally supplied signals.

Preferably, a start input is provided with circuitry connected thereto for initiating a test sequence in response to a start signal. In the preferred embodiment of the invention an initial test voltage is ground and then successively higher test voltages are generated.

Preferably a capacitor is connected to the analog signal line for storing a test voltage applied to the analog signal line. This has the effect of speeding up the test sequence.

Preferably the comparators are clocked differential comparators, the test signal being changed on each successive clock signal.

Typically the converter will comprise a decoder connected to an output of each comparator for generating a binary digital output signal representative of an input analog signal. The invention thus provides a way of fully testing the operation of the analog to digital converter, not only as a whole, but also in respect to individual components.

The invention also provides an integrated circuit comprising a converter as defined above.

In accordance with a further aspect of the invention, there is provided a method of testing an analog to digital converter comprising an analog signal line, a reference voltage divider and a plurality of comparator stages, each comparator stage having a first comparator input connected to the analog signal line and a second comparator input connected to receive a respective predetermined reference voltage from the reference voltage divider, the method comprising:

feeding an internally generated first test voltage to the first comparator input of said stages; and sequentially feeding a succession of test voltages from the voltage divider to the analog signal line.

Other objects, features and advantages of the invention will become apparent in light of the following description thereof.

BRIEF DESCRIPTION OF THE DRAWINGS

FIG. 6 is a set of waveform diagrams illustrating the operation of the test mode of the converter of FIG. 5;

DETAILED DESCRIPTION OF THE INVENTION

Figure 1:
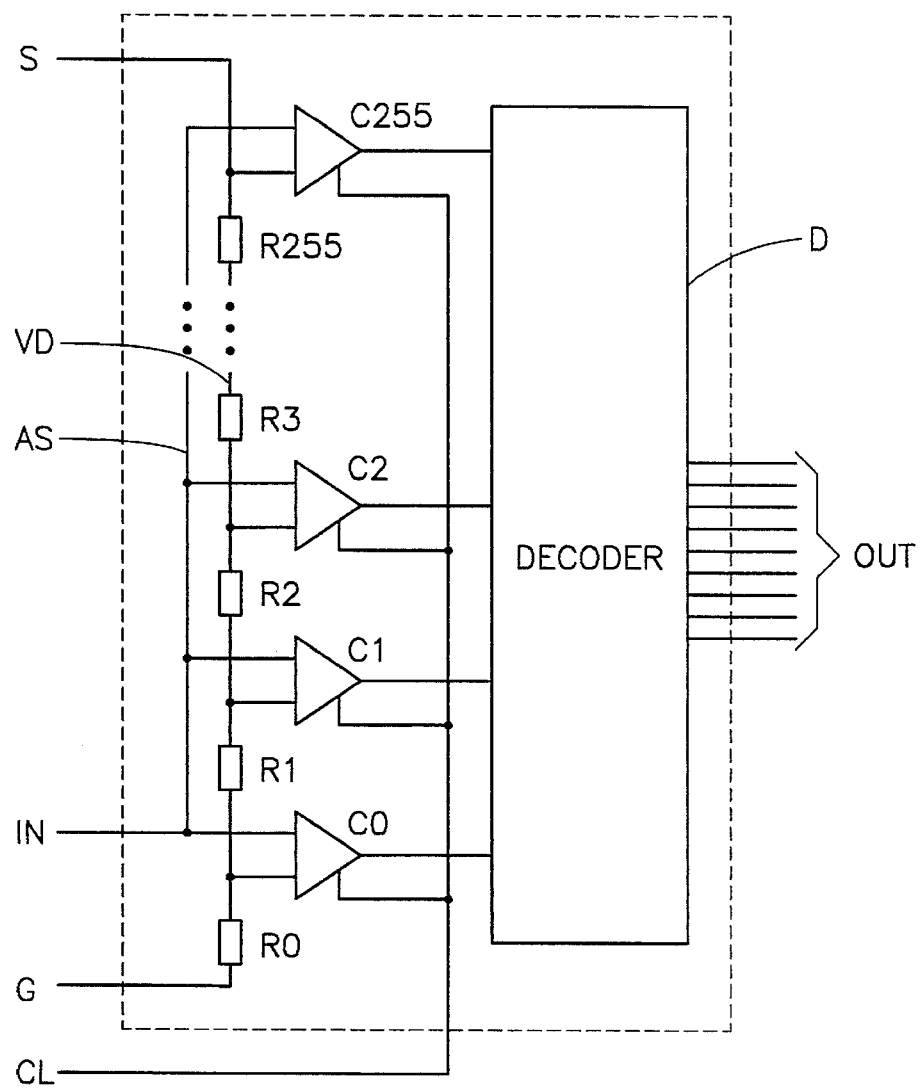
FIG. 1 is an example of a conventional flash analog to digital converter.
Figure 2:
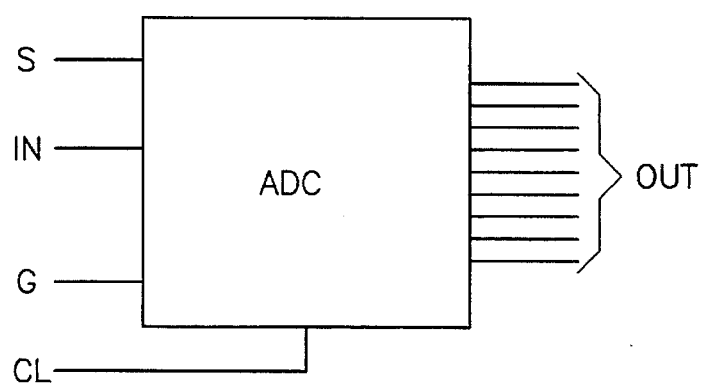
FIG. 2 is a schematic diagram of inputs to a conventional integrated analog to digital converter.
Figure 3:
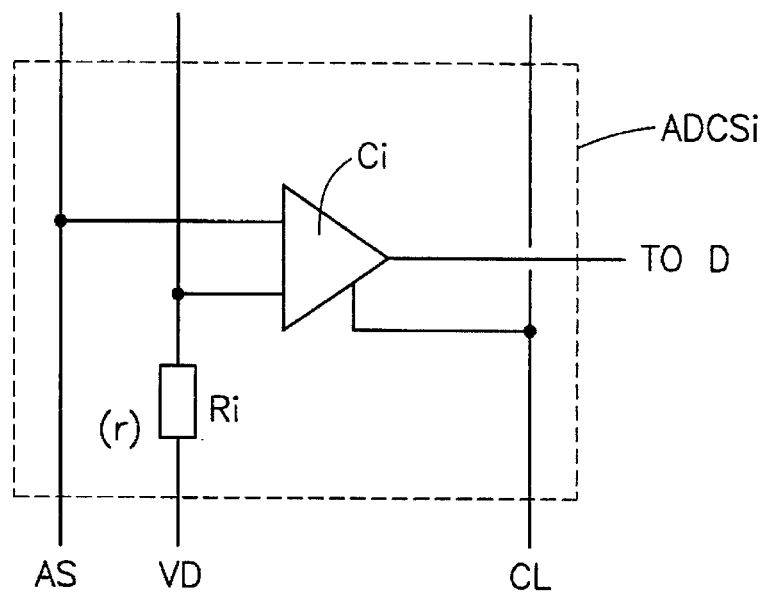
FIG. 3 is a schematic diagram of one stage of a conventional flash analog to digital converter.

FIG. 3 is a schematic representation of one analog to digital converter stage ADCSi of a conventional "flash" analog to digital converter of the type illustrated in FIG. 1. It will be seen that a conventional analog to digital converter stage ADCSi includes one resistive element Ri of the voltage divider VD, the resistive element Ri having a resistance r. The analog to digital converter stage also includes a comparator Ci with a first, signal, input connected to the input signal line AS and a second, reference, input, connected to a tap in the voltage divider RL. A clock signal is supplied via a clock signal line CL for causing the comparator Ci to sample the input voltage on the analog signal line AS. The output of comparator Ci is supplied to the decoder D for forming the binary output signal.

Figure 4:
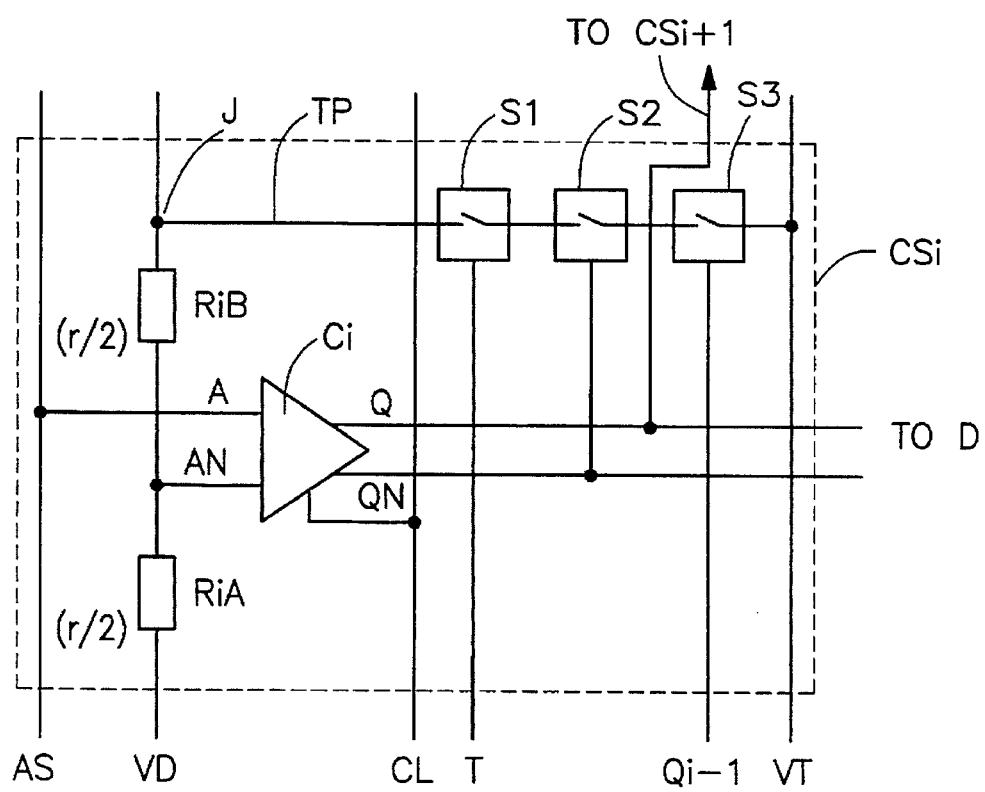
FIG. 4 is a schematic diagram of a one stage of a flash analog to digital converter in accordance with the invention.

FIG. 4 illustrates an example of an analog to digital converter comparator stage CSi of an analog to digital converter in accordance with the invention. It will be noted that rather than one resistive element Ri having a resistance r of FIG. 3, the comparator stage of FIG. 4 includes a pair of resistive elements RiA and RiB, each having a resistance of r/2. In other words, the resistor ladder chain forming the voltage divider VD contains twice the number of resisters compared to a conventional analog to digital converter, each of the resistive elements having half the standard resistance (r/2) so that the total ladder resistance remains the same. A first, signal input A of a comparator Ci, in the present instance a differential comparator, is connected to the analog signal line AS (see FIG. 1 input signal line IN). The second input AN of the comparator Ci is connected between the resistive elements RiA and RiB. Direct Q and inverted QN outputs are provided from the comparator Ci to the decoder D. In addition, a test path TP including series connection of three switches S1, S2 and S3 is connected at the junction J between the resistor RiB and the resistor (not shown) R(i+1)A of the next comparator stage CS(i+1). The test path TP of the stage connects the junction J between the resistor RiB and the resistor (not shown) R(i+1)A of the next comparator stage CS(i+1) to the test voltage line VT, which in turn is connected or connectable to the analog signal line AS.

A first switch S1 is controlled by a test input T. When the test input signal T is activated in a test mode it causes switch S1 to close. The switch $2 is responsive to the inverted output QN from the comparator Ci so that the switch S2 is closed when the signal voltage at A is less than the reference voltage at AN. The output signal Q from the comparator Ci, as well as being provided to the decoder D, is also supplied to the next higher comparator stage CS(i+1). The switch S3 is connected to the direct comparator output Q of the immediately preceding comparator stage CS(i−1) so that when the signal voltage at the input A of the comparator C(i−1) of the immediately preceding comparator stage CS(i−1) is greater than the reference voltage at the reference input AN thereof, the switch S3 of the stage CSi is closed.

In situations other than those specifically referenced above, the switches S1, S2 and S3 are open. It will be appreciated that as a result of the series connections, when each of the switches S1, S2 and S3 are closed, the reference voltage above the resistor RiB of the comparator stage CSi, will be fed to the test voltage line VT.

Figure 5:
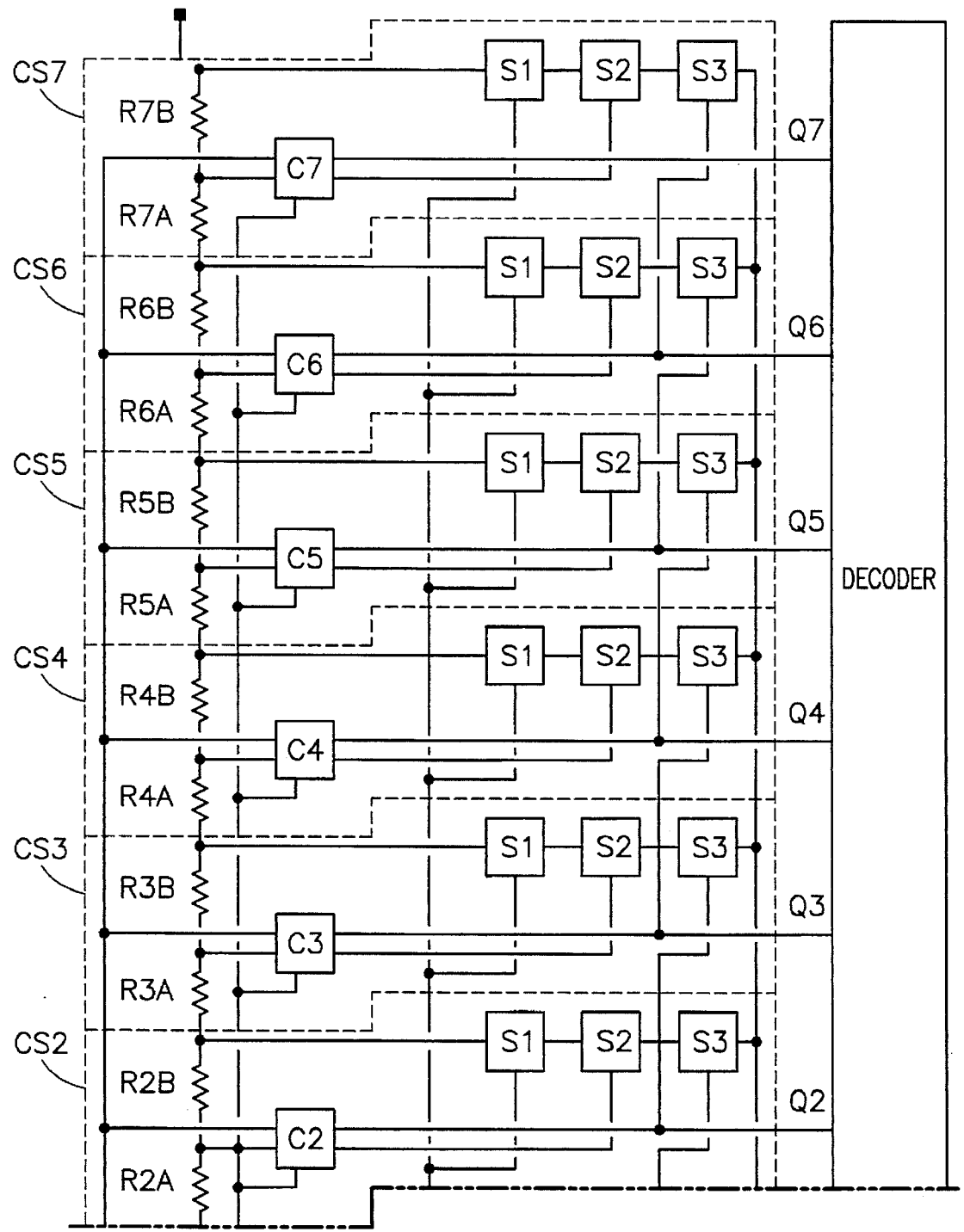
FIG. 5 is a simplified schematic diagram of a flash analog to digital converter in accordance with the invention.
Figure 5A:
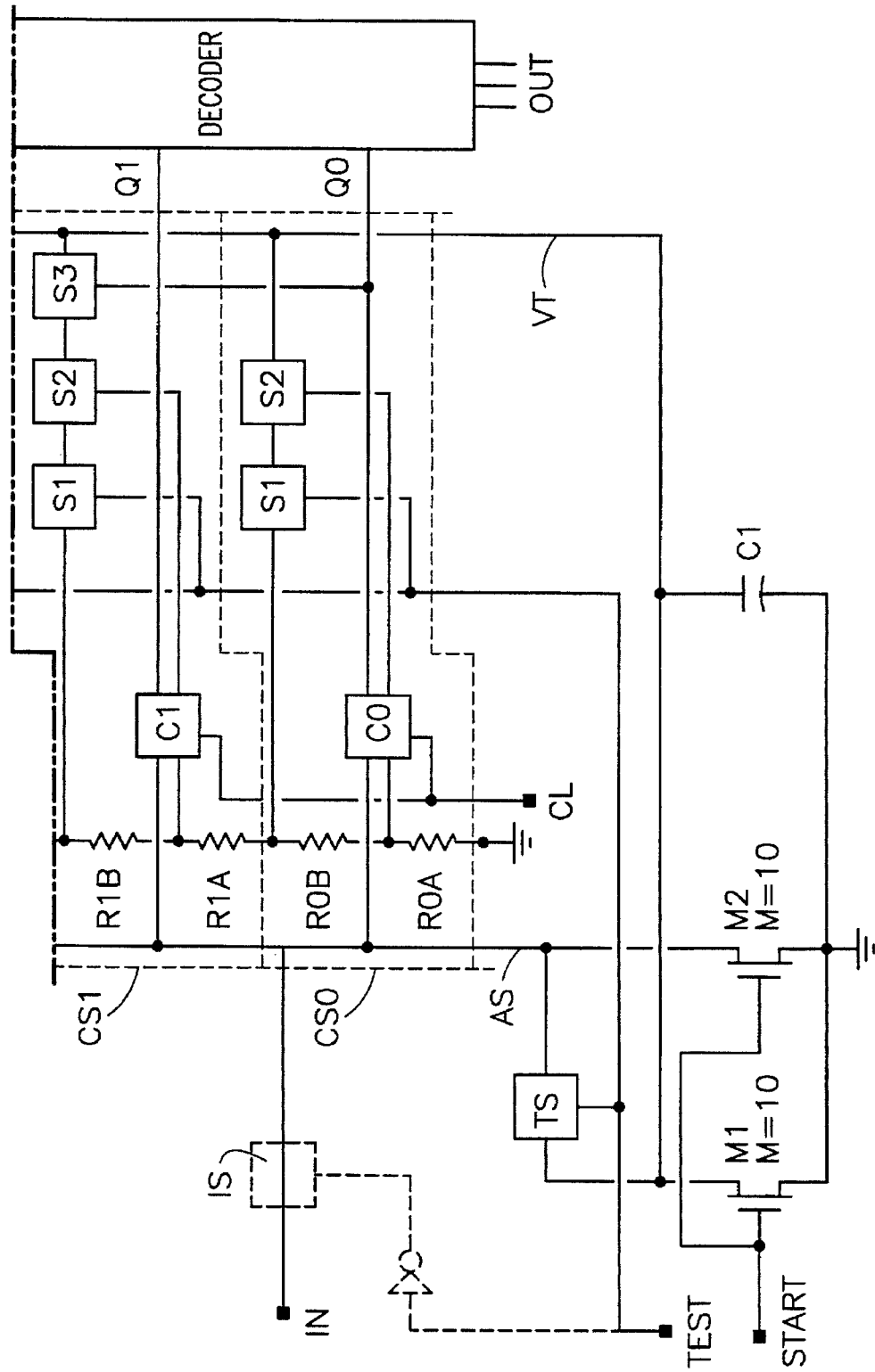

Reference will now be made to FIG. 5 which illustrates an example of an analog to digital converter in accordance the invention for providing a three bit digital output. It will be appreciated that the principles incorporated in the circuit of FIG. 5 can be applied to analog to digital converters for providing a binary digital output with a different number of bits, for example an eight bit output described above. The three bit digital output circuit of FIG. 5 is chosen for ease of explanation only.

It will be noted that the circuit shown in FIG. 5 comprises seven stages CS1–CS7 corresponding to the stages CSi shown in FIG. 4. Stage CS0 in FIG. 5 does not include a switch S3 as there is no preceding lower order stage from which an input can be provided. It will also be noted that the comparators C0–C7 in FIG. 5 may receive differential clock inputs CP and CPN, rather than a single ended clock signal CL as illustrated. The choice of single sided or differential clock signals is a matter of circuit design choice as will be apparent to one skilled in the art. The analog switches forming switches S1, S2 and S3 of the various stages can be implemented in any appropriate semiconductor switch technology, for example using MOS FET technology.

An addition to an analog signal input IN, FIG. 5 illustrates a test input TEST and a start input START. The test input TEST is connected via an inverter to an analog switch located between the analog input IN and the A input of the comparators C0–C7. The switch IS is an isolation switch which, on application of a test input signal to the TEST input causes the analog input IN to be isolated. This ensures that during a test mode, the internally generated test signals can be applied in sequence to the analog to digital converter circuitry. The TEST input. is also connected to the first switches S1 of the stages CS0–CS7 and to a further analog switch TS for connecting the test voltage line VT to the input A (line AS) of the comparators C0–C7. The START input is connected to the gates of first and second transistors M1 and M2. One side of the transistor M1 is connected to one side of the analog switch TS to the line VT, and also to one side of a capacitor C1. One side of the transistor M2 is connected to the other side of the analog switch TS and for the analog signal line AS. The other side of the transistors M1 and M2 are connected to the other side of the capacitor C1 and to ground.

The operation of the circuit of FIG. 5 will now be described with reference to the waveform diagrams in FIG. 6. FIG. 6a shows the clock signal CP. FIG. 6b shows the start signal START. FIG. 6c shows the voltage VT forming the test voltage applied to the inputs A of the comparators C0–C7. FIG. 6d illustrates the voltages supplied at the output Q0–Q7 from the comparators C0–C7.

Thus, initially, a test input signal is applied to the TEST input, which, by means of the isolation switch IS disconnects the input IN from the analog signal line AS and thus from the A inputs of the comparators C0–C7 and allows all the comparators C0–C7 to be driven from the internally generated voltages. The TEST signal also causes the switches S1 of each of the comparator stages CS0–CS7 to be closed.

Next a START impulse is supplied to the START input. This discharges the storage capacitor C1 and grounds the A input of all the comparators C0–C7. After a suitable delay, the test clock CL starts.

On the first clock edge of the clock signal CL, all the comparators have their A inputs at zero volts so they all switch their Q outputs to logic 0. This has the effect of resetting all internal nodes to 0 volts. On the falling CL clock edge, the START input signal is released, preparing the device for the internal test sequence.

Between the falling clock edge of the CL clock signal and the next rising edge, the analog switch S2 of stage CS0 is switched on by the QN output of its comparator C0. As both switches S1 and S2 of stage CS0 are closed, this causes the capacitor C1 to be charged to (2*VREF)/(r/2), where r/2 is the value of a single resistive element in the chain of paired series connected resistors forming the voltage divider VD. On the next clock edge, the comparator C0 compares its inputs and finds that its A input is at (2*VREF)/(r/2) and its AN input is at VREF/(r/2). As VREF is a positive voltage, the voltage at input A is thus greater than the voltage at the input AN of the comparator C0, so that comparator C0 switches its output Q to logical 1 and the output QN to logical 0.

The QN output of the comparator C0 opens the analog switch S1 of stage CS0. Switching the output Q of stage CS0 to logical 1 causes the switch S3 of stage CS1 to be closed connecting the output of the top of the resistor R1B to the test voltage line VT. This causes the capacitor C1 to be charged to (4*VREF)/(r/2).

On the next clock edge, the comparator C1 compares its inputs and finds that its A input is at (4*VREF)/(r/2) and its AN input is at (3*VREF)/(r/2). Accordingly, the Q output of comparator C1 goes to logical 1 and the QN output goes to logical 0. This causes the switch S2 of stage CS 1 to be opened and the switch S3 of the stage CS3 to be closed. Thus, the voltage from the top of the resistor R2B is then connected to the test voltage line VT. This process is continued on each clock edge until each of the comparators has switched in mm and the test voltage has reached VREF.

The eight outputs Q0–Q7 of the comparator stages CS0–CS7 are supplied to the decoder D for generating the three bit binary output OUT.

It will be appreciated that the circuit illustrated in FIG. 5 enables all of the test voltages to be generated internally to the circuit without needing an external DC voltage that has to be accurately stepped between 0 volts and VREF. To provide such an accurate external voltage would be very difficult in a test environment so that the invention provides an elegant solution to the provision of a means for testing each of the stages of the analog to digital converter. As only digital signals are used, the test program can be generated easily using a digital simulator and standard test program generation tools.

As the test voltage on the line VT increases in discrete steps proportional to each resistor, by measuring this value with a voltmeter, the value of each resistor in relation to the other can readily be determined. This allows the linearity of the data converter to be verified without significant difficulty.

Figure 7:
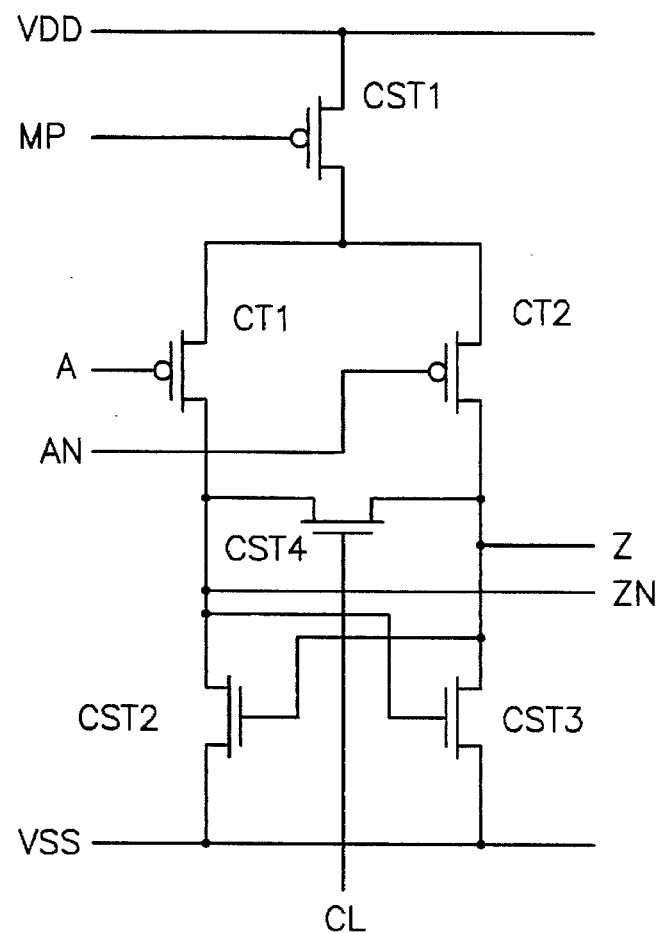
FIG. 7 is a circuit diagram of a differential comparator for use in the analog to digital converter of FIG. 5.

FIG. 7 is a simple circuit diagram illustrating a differential comparator which could be used for the comparators C0–C7.

Figure 8:
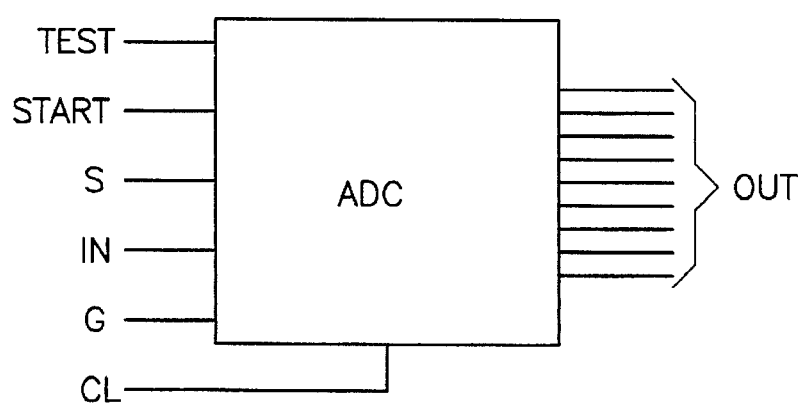
FIG. 8 is a schematic diagram of selected inputs to a integrated analog to digital converter in accordance with the invention.

FIG. 8 is a schematic block diagram illustrating the additional TEST and START inputs to an integrated circuit incorporating an analog to digital converter in accordance with the present invention.

Although the invention has been described with reference to particular embodiments, it will be appreciated by one skilled in the art that not limited thereto and that many modifications and/or additions may be made within the scope of the invention.

For example, although in the present embodiment the invention is implemented using FET technology, other embodiments could be implemented on other circuit technology. Also, the circuit configurations could be changed in accordance with design preferences.

The present invention, therefore, is well adapted to carry out the objects and attain the ends and advantages mentioned, as well as others inherent therein. While presently preferred embodiments of the invention have been given for purposes of disclosure, numerous changes in the details of construction, interconnection and arrangement of parts will readily suggest themselves to those skilled in the art and which are encompassed within the spirit of the invention and the scope of the appended claims.

What is claimed is:

1. An analog to digital converter, comprising:
   an analog signal line adapted to receive an analog voltage;
   a reference voltage divider including reference taps providing a plurality of predetermined reference voltage values and test taps providing a plurality of predetermined test voltage values different then the plurality of predetermined reference voltage values;
   a plurality of comparator stages, each of the plurality of comparator stages having a first comparator input connected to said analog signal line and a second comparator input connected to a respective one of said reference taps to receive a respective one of the plurality of predetermined reference voltage values from said reference voltage divider; and
   test mode circuitry connected to said test taps and operable in a test mode to sequentially feed a succession of the plurality of predetermined test voltage values from said voltage divider to said analog signal line for testing said analog to digital converter.

2. The converter according to claim 1, wherein the plurality of predetermined test voltage values have values between the plurality of predetermined reference voltage values.

3. The converter according to claim 1, wherein each of the plurality of comparator stages comprise first and second voltage divider outputs, said first voltage divider output of a comparator stage being connected to said second comparator input of said comparator stage and said second voltage divider output being connected via a stage test path to said analog signal line.

4. The converter according to claim 1, wherein said reference voltage divider comprises a chain of pairs of series connected resistor elements, said first and second voltage divider outputs for successive stages being defined at junctions between alternate resistor elements.

5. The converter according to claim 3, wherein said test path comprises a plurality of switches for each one of the plurality of comparator stages.

6. The converter according to claim 5, wherein said switches are connected in series.

7. The converter according to claim 6, wherein a first one of said plurality of switches for each one of said plurality of comparator stages is connected to a test input and is arranged to close upon application of a test mode signal applied to a test input.

8. The converter according claim 6, wherein a second one of said plurality of switches for each one of said plurality of comparator stages is connected to a comparator output of its respective comparator stage and is arranged to close upon a first predetermined comparison output signal.

9. The converter according to claim 8, wherein said first predetermined comparison output signal is indicative of a voltage at said first comparator input being less than a voltage at said second comparator input for said respective comparator stage.

10. The converter according to claim 6, wherein a third one of said plurality of switches for all but one of said plurality of comparator stages is connected to a comparator output of an adjacent comparator stage to its respective comparator stage and is arranged to close upon a second predetermined comparison output signal from said adjacent comparator stage.

11. The converter according to claim 10, wherein said adjacent comparator stage is an immediately preceding lower order comparator stage.

12. The converter according to claim 10, wherein said second predetermined comparison output signal is indicative of a voltage at said first comparator input being greater than a voltage at said second comparator input for said adjacent comparator stage.

13. The converter according to claim 1, wherein each comparator stage comprises a comparator having a reference input connected to a predetermined reference tap of said voltage divider, a test path connected to a tap intermediate said predetermined reference taps of adjacent comparator stages, said test path comprising in series a first switch connected to a test input and arranged to close on application of a test mode signal to said test input and a second switch connected to an output of said comparator and arranged to close on application of an output of a first predetermined comparison output from said comparator and wherein each comparator stage apart from a lowest order comparator stage additionally comprises a third switch connected to an output of said comparator of a preceding lower order stage and is arranged to close on application of an output of a second predetermined comparison output from said comparator of said preceding stage.

14. The converter according to claim 1, wherein said analog signal line is connected to an analog signal input via an isolation switch, said isolation switch being connected to a test input and being responsive to a test input signal at said test input to isolate said analog signal line from said analog signal input.

15. The converter according to claim 14, wherein said isolation switch is connected to said test input via an inverter.

16. The converter according to claim 1, further comprising a start input and circuitry connected thereto for initiating a test sequence in response to a start signal on said start input.

17. The converter according to claim 16, wherein an initial test voltage is at ground potential.

18. The converter according to claim 1, further comprising a capacitor connected to said analog signal line for storing a test voltage applied to said analog signal line.

19. The converter according claim 1, wherein each of said plurality of comparator stages is a clocked differential comparator, and said test signal being changed on each successive clock signal.

20. The converter according to claim 1, further comprising a decoder connected to an output of each of said plurality of comparator stages, said decoder generating a binary output signal representative of an input analog signal.

21. The converter according to claim 13, wherein the analog to digital converter is fabricated on a semiconductor integrated circuit.

22. The converter according to claim 21, where said integrated circuit has test and test start inputs.

23. A method of testing an analog to digital converter comprising an analog signal line, a reference voltage divider including reference taps providing a plurality of predetermined reference voltage values and test taps providing a plurality of predetermined test voltage values, wherein the plurality of predetermined test voltage values are different from the plurality of predetermined reference voltage values, and a plurality of comparator stages, the plurality of comparator stages each having a first comparator input connected to said analog signal line, a second comparator input connected to receive a respective one of the plurality of predetermined reference voltage values from said reference voltage divider and a digital output, said method comprising the steps of:

feeding a succession of the plurality of predetermined test voltage values from said voltage divider to said analog signal line connected to the first input of each of said plurality of comparator stages; and determining that logic values of the digital outputs of said plurality of comparator stages correspond with the plurality of predetermined test voltage values from said voltage divider.

24. The method according to claim 23, wherein the plurality of predetermined test voltage values are intermediate the plurality of predetermined reference voltage values.

25. A method according to claim 23, wherein the succession of the plurality of predetermined test voltage values feeding said analog signal line change on each occurrence of a dock signal.

* * * * *